July 19, 1966 E. HEINECKE 3,262,067

CLOSE B BIASED LINEAR AMPLIFIER WITH AN EFFICIENCY COMPARABLE TO A CLASS C AMPLIFIER

Filed April 1, 1963

INVENTOR

ERICH HEINECKE

BY Percy P. Lantzy

ATTORNEY

United States Patent Office 3,262,067
Patented July 19, 1966

3,262,067

CLASS B BIASED LINEAR AMPLIFIER WITH AN EFFICIENCY COMPARABLE TO A CLASS C AMPLIFIER

Erich Heinecke, Berlin-Tempelhof, Germany, assignor to International Standard Electric Corporation, New York, N.Y., a corporation of Delaware Filed Apr. 1, 1963, Ser. No. 269,458
Claims priority, application Germany, Apr. 26, 1962, St 19,163
7 Claims. (Cl. 330—126)

This invention relates to amplifiers and more particularly to radio frequency amplifiers having a linear dependency between the exciting alternating current voltage and the resultant anode alternating current and a very high efficiency.

It is known that linear amplifiers employing electronic tubes and resonant output circuits can be operated linearly if biased for class A or class B operation. It is known that amplifiers biased for class AB operation exhibit no linear amplification characteristic. It is further known that amplifiers biased for class C operation exhibit a non-linear amplification characteristic due to the operating angle (angle of anode current flow) being dependent on the amplitude of the input or exciting voltage. However, it is also known that amplifiers biased for class C opeiation have the advantage of higher efficiency as compared with those amplifiers biased for class B operation.

The comparison of efficiency between class C and class B operation can be demonstrated by a numerical example assuming that the anode voltage efficiency factor is 0.93. A class B amplifier having an operating angle of 180° has a current efficiency factor of 1.57 and at peak power reaches the plate efficiency $$n=\frac{\text{current factor}\times\text{voltage factor}}{2}=\frac{1.57\times 0.93}{2}=0.73$$

as an optimum, while a class C amplifier with an operating angle of 120° and a current efficiency factor of 1.794 at peak power reaches the efficiency $$n=\frac{1.794\times 0.93}{2}=0.835$$

The efficiency for class C operation can be improved by decreasing the operating angle.

An object of this invention is to provide a high efficiency linear amplifier having the linear amplification characteristic of the class B operation and an efficiency approaching that of class C operation.

A feature of this invention is the provision of an amplifier biased for operation as a class B amplifier and exciting this amplifier by a composite signal formed from the fundamental frequency wave of the signal to be amplified and at least one harmonic thereof combined to supplement each other in phase, amplitude and modulation. The resultant composite signal will exhibit a positive portion covering substantially less than one half cycle of the composite signal and will produce in the anode circuit of the class B amplifier an anode current flow angle of substantially less than 180°. Since the amplifier stage is biased for class B operation, the angle of current flow does not change with the amplitude of the exciting voltage and, thus, the amplification characteristic remains linear while the efficiency corresponds to that normally found in amplifiers operating in class C.

Another feature of this invention is the provision of circuitry including a driving amplifier stage having in the anode circuit thereof an output tuned circuit resonant at both the fundamental and at least one harmonic of the signal to be amplified to provide the composite signal.

Still another feature of this invention is the provision of separate and independent driving stages to produce the fundamental frequency component and the harmonic component of the composite signal and a combining arrangement to combine these two components to provide a composite signal.

A further feature of this invention is that the anode circuit of the class B amplifier stage includes a tuned circuit resonant at the fundamental frequency of the signal to be amplified.

The above-mentioned and other features and objects of this invention will become more apparent by reference to the following description taken in conjunction with the accompanying drawings, in which.

Figure 1:
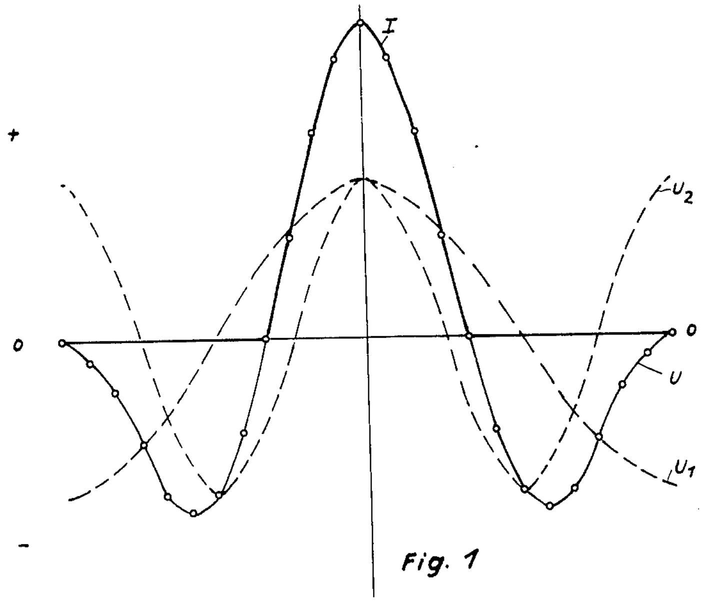
FIG. 1 illustrates an example of how the composite signal exciting the class B amplifier of this invention is produced.

Referring to FIG. 1, the production of the exciting voltage in accordance with the principles of this invention and the advantage achieved by employing the produced complex exciting voltage will be demonstrated with the aid of an example. The waveform of the fundamental frequency of the signal to be amplified is $U_1 \cos \omega t$, illustrated by the dotted curve $U_1$, and the waveform of the second harmonic of the signal to be amplified is $U_2 \cos 2\omega t$, illustrated by the dotted curve labeled $U_2$. When these two waveforms are added together the composite signal labeled U, illustrated by the solid line curve, results. Thus, the curve U is the sum of the voltages $U_1 \cos \omega t + U_2 \cos 2\omega t$, with $U_1 = U_2$ in the example herein employed. It will be observed that the composite signal U is positive for 120° of the cycle and negative for 240° of the cycle. When this is applied to the input of an amplifier operating as a class B amplifier, the plate voltage will have the waveform of that portion of the composite signal above the zero axis labeled I with a resultant angle of current flow of 120°. By splitting up the current flow curve into fundamental wave current and direct current, the current efficiency factor is $$\frac{i_{ac}}{i_{dc}}=1.806$$

It will be observed that this current factor is a little higher than the current factor 1.794 resulting from a class C amplifier having an operating angle or anode current flow angle of 120°. The current efficiency factor produced by the composite signal in accordance with this invention depend only on the ratio $U_1/U_2$ which remains unchanged during modulation and, consequently, the amplification characteristic remains linear which is contrary to an amplifier biased for class C operation where the current flow angle changes with changes in amplitude of the exciting voltage.

The higher efficiency may also be demonstrated by a numerical example assuming an efficiency plate voltage factor of 0.93:

$$n=\frac{\text{current factor}\times\text{voltage factor}}{2}$$

(1) Class B amplifier $$n=\frac{1.57\times 0.93}{2}=73.2\%$$

(2) Class B amplifier feature acc. to the invention $$n=\frac{1.806\times 0.93}{2}=84.0\%$$

(3) Class C amplifier (120°) nonlinear $$n=\frac{1.794\times 0.93}{2}=83.5\%$$

Another advantage of the present invention is that the power of the exciting signal or composite signal, as it is called herein can be kept low. This is important when considering the overall efficiency of a transmitter system since the driver energy or power must be considered along with the power of the amplifier to obtain the overall efficiency of a transmitter system. A high power tube with 320 kw. peak power in a grounded grid circuit requires approximately 20 kw. control power when operated as a standard class B amplifier. For a class C amplifier with 120° current flow angle there is required an exciting waveform having double the power, 40 kw., to obtain the same output current from the amplifier. In accordance with the arrangement of this invention it is required that the composite signal have a voltage whose positive peak value is U which is equal to the sum of the positive peaks of the waveforms $U_1 \cos \omega t + U_2 \cos 2\omega t$ or, in other words, U is equal to $U_1+U_2$. Since in accordance with our example $$U_1=U_2=\frac{U}{2}$$

each of the waves furnishes the voltage $U/2$ and, consequently, $1/2$ or, in other words, ¼ of the control power. Thus, when compared with the normal class B amplifier, the control power is ¼+¼=½ the power required for normal class B operation at an efficiency corresponding to the anode current flow angle of 120°. This control power of the improved amplifier of this invention is ¼ that required for class C operation.

Figure 2:
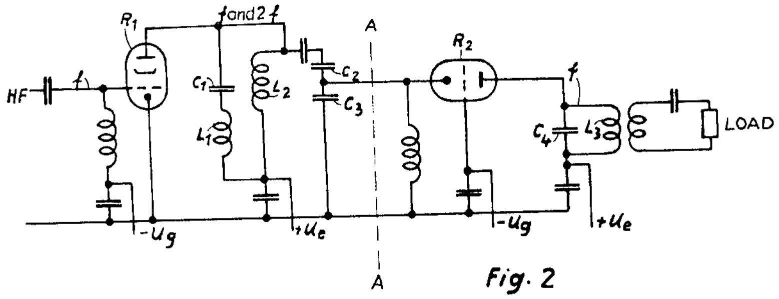
FIG. 2 is a schematic diagram illustrating one embodiment of a linear amplifier in accordance with the principles of this invention.

Referring to FIG. 2, there is illustrated therein a schematic diagram of an embodiment of this invention to generate the composite signal utilized in accordance with the principles of this invention. A signal having a frequency $f$ is coupled to the control grid of a driver stage amplifier tube $R_1$ which includes in its anode circuit a network which possesses voltage resonance for the fundamental freguency $f$ and the second harmonic $2f$. The series circut including inductor $L_1$ and capacitor $C_1$ is coupled in parallel with the parallel connected resonant circuit including inductor $L_2$, capacitor $C_2$ and capacitor $C_3$. These series and parallel circuits are each tuned to a frequency lying betwen $f$ and $2f$. Capacitor $C_1$, inductor $L_1$, inductor $L_2$, capacitor $C_2$ and capacitor $C_3$ are dimensioned in such a way that, for frequency $f$, the network including capacitor $C_1$ and inductor $L_1$ exhibit a capacitive reactance equal to the inductive reactance exhibited by the network including inductor $L_2$, capacitor $C_2$ and capacitor $C_3$ and, for a frequency $2f$, the network including inductor $L_1$ and capacitor $C_1$ exhibits an inductive reactance equal to the capacitive reactance of the network including inductor $L_2$, capacitor $C_2$ and capacitor $C_3$. Thus, capacitor $C_1$, inductor $L_1$, inductor $L_2$, capacitor $C_2$, and capacitor $C_3$ have a voltage resonance for both $f$ and $2f$.

Capacitors $C_2$ and $C_3$ are arranged to form a capacitive voltage divider from which the composite signal U is derived for exciting the amplifier $R_2$ operating in a grounded grid circuit. The exciting voltage U contains the fundamental frequency voltage $U_1$ as well as the second harmonic voltage $U_2$ having a magnitude determined by the plate current of the driver tube $R_1$. Since tube $R_1$ and tube $R_2$ are each biased by the voltages $U_g$ for class B operation, the amplitude of the second harmonic in the anode circuit of sinusoidally actuated tube $R_1$ is 0.425 of the fundamental wave current. Therefore, $U_2=0.425U_1$ which results in a current efficiency factor of 1.725 for tube $R_2$ and provides an efficiency of $$n=1.725\times\frac{0.93}{2}=0.803$$

The output of tube $R_2$ is coupled to a tuned circuit including capacitor $C_4$ and inductor $L_3$ tuned to the fundamental frequency $f$ from which the amplified signal can be coupled to an appropriate load.

According to the invention, as pointed out hereinabove, the circuit arrangement of FIG. 2 is linear even when the input or exciting voltage U is modulated. It is also possible to adjust the amplitude of the fundamental and harmonic waveforms composing the composite signal to obtain other ratios of $U_1/U_2$ in order to further improve the efficiency.

While the circuit arrangement of FIG. 2 will carry out the purpose of this invention, it will be apparent that the driver tube $R_1$ must be designed to provide the total voltage and total current for the produced composite signal which could result in a lower driver efficiency. The driver tube $R_1$ will have the same plate current as the standard driver for the normal class B amplifier operation but the final efficiency is improved in accordance with the principles of this invention and as compared with a class C amplifier only one-half of the driver input power is required for the single driver tube operation as illustrated in FIG. 2.

Figure 3:
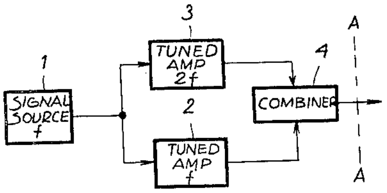
FIG. 3 is a schematic diagram in block form of an alternative embodiment of that portion of FIG. 2 to the left of line A—A.

Referring to FIG. 3, there is illustrated therein in block diagram form an arrangement which would improve the efficiency of the driver stage. In this arrangement the signal having a frequency $f$ is applied from source 1 to two driver stages 2 and 3, one stage tuned to the fundamental $f$ and the other stage tuned to the second harmonic. The outputs of the amplifiers 2 and 3 would be coupled to a combiner 4 to combine the two resultant signals to produce the composite signal U as illustrated in FIG. 1. The output of combiner 4 will then be coupled to the amplifier $R_2$ as illustrated in FIG. 2.

Throughout the description of the operation of this invention, the exciting voltage or composite signal has been described as being composed only of the fundamental frequency and the second harmonic. In the limit the voltage of the second harmonic $U_2$ should not be greater than the voltage $U_1$ because positive peaks would occur in the second harmonic voltage impairing the current factor.

If it is desired to reduce the anode current flow angle to a value less than 120° in order to improve the current efficiency factor and, consequently, the efficiency, this can be done by adding other harmonics of the fundamental frequency where their amplitude and phases are chosen so that outside the resultant positive curve derived, no other positive peaks occur.

While I have described above the principles of my invention in connection with specific apparatus, it is to be clearly understood that this description is made only by way of example and not as a limitation to the scope of my invention as set forth in the objects thereof and in the accompanying claims.

I claim:

1. A linear amplifier having high efficiency comprising:

a source of input signal to be amplified having a given fundamental frequency;

circuitry coupled to said source to produce a first signal at said given fundamental frequency and a second signal at a given harmonic of said given fundamental frequency and to combine said first and second signals to produce a composite signal having a positive portion covering substantially less than one half a cycle of said composite signal; and a first class B biased amplifier stage coupled to said circuitry for substantially linear amplification of said composite signal with an efficiency comparable to a class C amplifier;

said first amplifier stage including an electron discharge device having at least an anode, a cathode and a control grid, means coupling said cathode to said circuitry to have impressed said composite signal on said cathode, ground potential, means coupling said control grid to said ground potential to ground said control grid with respect to said composite signal, and a first tuned circuit connected to said anode resonant at said given fundamental frequency to provide an output signal by extracting said given fundamental frequency from said amplified composite signal.

2. An amplifier according to claim 1, wherein said circuitry includes a second tuned circuit having voltage resonance at both said given fundamental frequency and said given harmonic of said given fundamental frequency.

3. An amplifier according to claim 2, wherein said circuitry further includes a second class B biased amplifier stage coupled between said second tuned circuit and said source.

4. An amplifier according to claim 2, wherein said second tuned circuit includes a first capacitor and a first inductor coupled in a series resonant circuit tuned to a selected frequency between said fundamental frequency and said given harmonic of said fundamental frequency, a second inductor;

second and third capacitors in a series circuit coupled in parallel to said second inductor to provide a parallel resonant circuit tuned to said selected frequency, and means coupling said parallel resonant circuit in parallel relation with said series resonant circuit, said series resonant circuit and said parallel resonant circuit having voltage resonance at both said given fundamental frequency and said given harmonic of said given fundamental frequency, the junction between said second and third capacitors being coupled to said cathode of said first class B biased amplifier stage.

5. An amplifier according to claim 4, wherein said first and second inductors and said first, second and third capacitors are selected to render said series resonant circuit and said parallel resonant circuit voltage resonant to both said given fundamental frequency and the second harmonic of said given fundamental frequency.

6. An amplifier according to claim 1, wherein said circuitry includes a first tuned amplifier tuned to said given fundamental frequency to produce said first signal, a second tuned amplifier tuned to said given harmonic of said given fundamental frequency to produce said second signal, and a combiner coupled to the outputs of said first and second tuned amplifier to produce said composite signal, the output of said combiner being coupled to said cathode of said first class B biased amplifier stage.

7. An amplifier according to claim 6, wherein said second tuned amplifier is tuned to the second harmonic of said given fundamental frequency.

References Cited by the Examiner

UNITED STATES PATENTS

| | | | |
|---|---|---|---|
| 1,925,520 | 9/1933 | Bushbeck | 328—16 |
| 3,150,327 | 9/1964 | Taylor | 330—126 |
| 3,172,052 | 3/1965 | Dome | 330—158 |

FOREIGN PATENTS

| | | |
|---|---|---|
| 218,457 | 11/1958 | Australia. |
| 822,591 | 10/1959 | Great Britain. |

OTHER REFERENCES

Terman: Radio Engineering, 3d ed., McGraw-Hill, N.Y., 1947, pp. 304–307.

Ladner and Stoner: Short Wave Wireless Communication, 5th ed., Chapman and Hall, London, 1950, pp. 359–366.

ROY LAKE, *Primary Examiner.*

R. P. KANANEN, *Assistant Examiner.*